US011830991B2

(12) United States Patent
Kwon et al.

(10) Patent No.: US 11,830,991 B2
(45) Date of Patent: Nov. 28, 2023

(54) METHOD AND APPARATUS BASED ON NEURAL NETWORK FOR PRE-DIAGNOSING DEFECT AND FIRE IN BATTERY CELL

(71) Applicants: KOREA POWER CELL CO., LTD., Daejeon (KR); ROBOVOLT CO., LTD., Daejeon (KR)

(72) Inventors: Jin Geun Kwon, Daejeon (KR); Jun Ki Hong, Daejeon (KR); Dong Heon Lee, Daejeon (KR)

( * ) Notice: Subject to any disclaimer, the term of this patent is extended or adjusted under 35 U.S.C. 154(b) by 349 days.

(21) Appl. No.: 17/120,094

(22) Filed: Dec. 11, 2020

(65) Prior Publication Data
US 2022/0052389 A1     Feb. 17, 2022

(30) Foreign Application Priority Data
Aug. 14, 2020    (KR) .................... 10-2020-0102195

(51) Int. Cl.
    *G01R 31/385*     (2019.01)
    *G06N 3/04*     (2023.01)
    *H01M 10/48*     (2006.01)

(52) U.S. Cl.
    CPC ........ *H01M 10/486* (2013.01); *G01R 31/385* (2019.01); *G06N 3/04* (2013.01)

(58) Field of Classification Search
    CPC ........ H01M 10/486; H01M 2010/4271; G06N 3/04; G06N 3/045; G06N 20/00;
(Continued)

(56) References Cited

U.S. PATENT DOCUMENTS

| 6,208,117 B1 * | 3/2001 | Hibi ..................... H02J 7/0014 320/136 |
| 8,626,679 B2 * | 1/2014 | Cho ....................... B60L 58/21 324/426 |

(Continued)

FOREIGN PATENT DOCUMENTS

| CN | 102483441 B | * | 6/2014 | .............. B60L 50/16 |
| EP | 2778700 A2 | * | 9/2014 | ........... G01R 31/362 |

(Continued)

OTHER PUBLICATIONS

A Real-Time Algorithm for Signal Analysis with the Help of the Wavelet Transform in Wavelets: Time-Frequency Methods and Phase Space, J.M. Combes et al., eds., pp. 286-297, 1987 (M. Holschneider, R Kronland-Martinet, J Morlet, and PH. Tchamitchian).

(Continued)

*Primary Examiner* — Jeffrey P Aiello
(74) *Attorney, Agent, or Firm* — Revolution IP, PLLC

(57) ABSTRACT

The prevent invention relates a method and apparatus based on neural network for pre-diagnosing defect and fire in battery cell. A method based on neural network for pre-diagnosing defect and fire in battery cell in an apparatus for pre-diagnosing defect and fire in battery cell is proposed, the method including collecting, by the battery cell defect and fire pre-diagnosis apparatus, data including at least one of chemical composition, current, voltage, and temperature data measured for each predetermined time interval within each charge and discharge cycle while charging and discharging a plurality of batteries; training, by the battery to cell defect and fire pre-diagnosis apparatus, the neural network by inputting the collected data to the neural network; and predicting, by the battery cell defect and fire pre-diagnosis apparatus, a battery deviated from a main cluster of the neural network as defective.

8 Claims, 7 Drawing Sheets

(58) Field of Classification Search
CPC ............ G06N 3/047; G06N 3/08; G06N 7/01; G06N 3/02; G01R 31/392; G01R 31/367; Y02E 60/10; Y02T 10/70; G06F 18/2178; G06F 17/18
USPC ...... 73/114.61; 320/107, 112, 132–134, 162; 324/426; 702/63, 182–185, 188–189; 703/2, 11; 706/12, 15, 20–21
See application file for complete search history.

(56) References Cited

U.S. PATENT DOCUMENTS

| | | | |
|---|---|---|---|
| 2005/0194936 | A1 | 9/2005 | Cho |
| 2014/0278169 | A1* | 9/2014 | Kim ................ G01R 31/367 702/63 |
| 2019/0187212 | A1* | 6/2019 | Garcia ............. G01R 31/382 |
| 2019/0257886 | A1* | 8/2019 | Hooshmand ......... G06N 3/044 |
| 2022/0334189 | A1* | 10/2022 | Min ................ H01M 10/425 |

FOREIGN PATENT DOCUMENTS

| | | |
|---|---|---|
| JP | 2017-123245 A | 7/2017 |
| KR | 10-0651573 | 11/2006 |
| KR | 10-0793616 | 1/2008 |
| KR | 10-2009-0020362 | 2/2009 |
| KR | 10-1031722 | 4/2011 |
| KR | 10-1413957 | 6/2014 |
| KR | 10-1423961 | 7/2014 |
| KR | 10-1551062 | 9/2015 |
| KR | 10-1588573 | 1/2016 |
| KR | 10-2016-0057150 | 5/2016 |
| KR | 10-2016-0100673 | 8/2016 |
| KR | 10-1745167 | 6/2017 |
| KR | 10-2017-0085365 A | 7/2017 |
| KR | 10-1805514 | 11/2017 |
| KR | 10-1839976 | 3/2018 |
| KR | 10-1863036 | 5/2018 |
| KR | 10-2019-0088845 | 7/2019 |
| KR | 10-2019-0100114 | 8/2019 |
| KR | 10-2106775 | 4/2020 |
| KR | 10-2020-0061704 | 6/2020 |

OTHER PUBLICATIONS

Multi-scale context aggregation by dilated convolutions, 2016 Int'l Conference on Learning Representations (ICLR) (Fisher Yu).

* cited by examiner

METHOD AND APPARATUS BASED ON NEURAL NETWORK FOR PRE-DIAGNOSING DEFECT AND FIRE IN BATTERY CELL

CROSS REFERENCE TO RELATED APPLICATION

The present application claims priority to Korean Patent Application No. 10-2020-0102195, filed Aug. 14, 2020, the entire contents of which is incorporated herein for all purposes by this reference.

TECHNICAL FIELD

The present invention relates to a method of diagnosing a defect and fire of a battery cell and, more particularly, to a method and apparatus based on neural network for pre-diagnosing defect and fire in battery cell.

BACKGROUND

Various types of eco-friendly vehicles are being developed, and among such vehicles, electric vehicles have attracted the most attention.

Since the electric vehicle uses the charging and discharging energy of a battery pack to drive the vehicle, the electric vehicle is receiving good responses from consumers in regard to having excellent fuel economy and reducing pollutants, compared to a car using only a gas engine. Accordingly, more interest and research are being focused on batteries that are key parts of electric vehicles.

As the number of products using batteries increases, the problem of battery safety is becoming more important. Moreover, in the case of the electric vehicle, since a plurality of battery cells, which are secondary batteries, constitute one pack, and multiple packs constitute one large-capacity battery, it is increasingly important to keep the battery safe, compared to general portable electrical products.

In particular, resistance occurs due to aging of battery cells constituting a battery or loosening of a bus bar for connection between battery cells. When such resistance increases, heat may be generated in the battery, which may cause damage to the internal circuit of the battery or the battery itself. Furthermore, it may lead to an explosion of the battery and cause a fire.

Therefore, a technology for diagnosing a defect of the battery is needed. Herein, although there exists a method of collecting current, voltage, and temperature data and analyzing the collected current, voltage, and temperature data to diagnose the defect of the battery while charging and discharging the battery in the related art, it takes a long time to complete a full charge and discharge cycle in the case of a large-capacity battery which is capable of 2000 charge and discharge cycles. Accordingly, it is virtually impossible to collect current, voltage, and temperature data by charging and discharging the large-capacity battery.

Meanwhile, some lithium-ion battery manufacturers use a method of aging the produced lithium battery over a period of one or two months, and for the purpose of this, a huge warehouse is being used.

However, when producing the battery cell and when examining the lithium battery cells currently in operation, there is currently no way to quickly test the batteries.

Documents of Related Art

[Patent Document 1] Korean Patent No. 10-1551062
[Patent Document 2) Korean Patent No. 10-1745167

SUMMARY

Accordingly, the present invention has been made keeping in mind the above problems occurring in the related art, and an objective of the present invention is to provide a method and apparatus based on a neural network for pre-diagnosing defect and fire in battery cell, the method and apparatus configured to be capable of guaranteeing the stability of a large-capacity battery on the basis of data without additional devices.

Another objective of the present invention is to provide a method and apparatus based on a neural network for pre-diagnosing defect and fire in battery cell, the method and apparatus configured to be capable of quickly inspecting a high-capacity battery cell.

In order to achieve the above objectives, according to a first embodiment of the present invention, A method based on neural network for pre-diagnosing defect and fire in battery cell in an apparatus for pre-diagnosing defect and fire in battery cell is provided, the method including collecting, by the battery cell defect and fire pre-diagnosis apparatus, data including at least one of chemical composition, current, voltage, and temperature data measured for each predetermined time interval within each charge and discharge cycle while charging and discharging a plurality of batteries; training, by the battery cell defect and fire pre-diagnosis apparatus, the neural network by inputting the collected data to the neural network; and predicting, by the battery cell defect and fire pre-diagnosis apparatus, a battery deviated from a main cluster of the neural network as defective.

Preferably, the method may further include predicting, by the battery cell defect and fire pre-diagnosis apparatus, voltage and temperature data by inputting current data of the battery predicted as defective to the neural network; comparing, by the battery cell defect and fire pre-diagnosis apparatus, the predicted voltage and temperature data with actual voltage and temperature data, respectively; determining, by the battery cell defect and fire pre-diagnosis apparatus, the battery predicted as defective to be normal, when differences between the predicted voltage and temperature data and the actual voltage and temperature data are within predetermined ranges, respectively; and determining, by the battery cell defect and fire pre-diagnosis apparatus, the battery predicted as defective to be defective, when the differences between the predicted voltage and temperature data and the actual voltage and temperature data are out of the predetermined ranges, respectively.

Preferably, the method may further include inputting, by the battery cell defect and fire pre-diagnosis apparatus, chemical composition, voltage, current, and temperature data of a new battery into the neural network for three charge and discharge cycles; and determining, by the battery cell defect and fire pre-diagnosis apparatus, whether the new battery is defective through the neural network.

Preferably, the method may further include inferring, by the battery cell defect and fire pre-diagnosis apparatus, voltage and temperature data of a latter part on the basis of time series voltage and temperature data of a former part.

Preferably, the method may further include inferring, by the battery cell defect and fire pre-diagnosis apparatus, voltage and temperature data of a latter part on the basis of time series current data of a former part.

Preferably, the method may further include detecting, by the battery cell defect and fire pre-diagnosis apparatus, the defect of the battery cell through a neural network obtained by adding a neural network learned through data including a label indicating normal or defective battery to the neural network learned through a self-supervised learning.

According to a second embodiment of the present invention, a method based on neural network for pre-diagnosing defect and fire in battery cell includes training, by a battery cell fault diagnosis apparatus, an artificial intelligence neural network for a battery cell defect diagnosis method, by using current, voltage, or temperature data measured in time series and first labeled data added to the current, voltage, and temperature data when charging and discharging a plurality of first batteries a first plurality of times; generating, by the battery cell defect and fire pre-diagnosis apparatus, second labeled data by adding labels to the current, voltage, and temperature data measured in time series when charging and discharging a plurality of second batteries a second plurality of times equal to or less than the first plurality of times, by using the trained artificial intelligence neural network; updating, by the battery cell defect and fire pre-diagnosis apparatus, the first labeled data by adding data satisfying a predetermined condition among the second labeled data to the first labeled data; and training, by the battery cell defect and fire pre-diagnosis apparatus, the artificial intelligence neural network for a battery cell defect diagnosis method using the updated first labeled data.

According to a third embodiment of the present invention, the apparatus for pre-diagnosing defect and fire in battery cell includes a memory storing one or more instructions; and one or more processors constituting a neural network that predicts a defect of a plurality of batteries by receiving data including at least one of chemical composition, current, voltage, and temperature data measured at predetermined time intervals within each charge and discharge cycle while charging and discharging the plurality of batteries, by executing the stored one or more instructions.

Preferably, the apparatus may further include a charger charging the plurality of batteries; and a discharger discharging the plurality of batteries, wherein the at least one processor automatically sets a charging schedule of the charger according to the input chemical composition, and automatically sets a discharge schedule of the discharger according to the input chemical composition.

Preferably, the at least one processor may add a label to data of a battery predicted as defective among the plurality of batteries, and input the labeled data to the neural network to train the neural network.

As described above, since the present invention provides the method and apparatus based on neural network for pre-diagnosing defect and fire in battery cell that collects data including at least one of chemical composition, current, voltage, and temperature data measured for each predetermined time interval within each charge and discharge cycle while charging and discharging a plurality of batteries and then inputs the collected data into the neural network to diagnose the defect of the battery cell, it is possible to guarantee the stability of a large-capacity battery on the basis of data without additional devices and inspect the large-capacity battery quickly.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
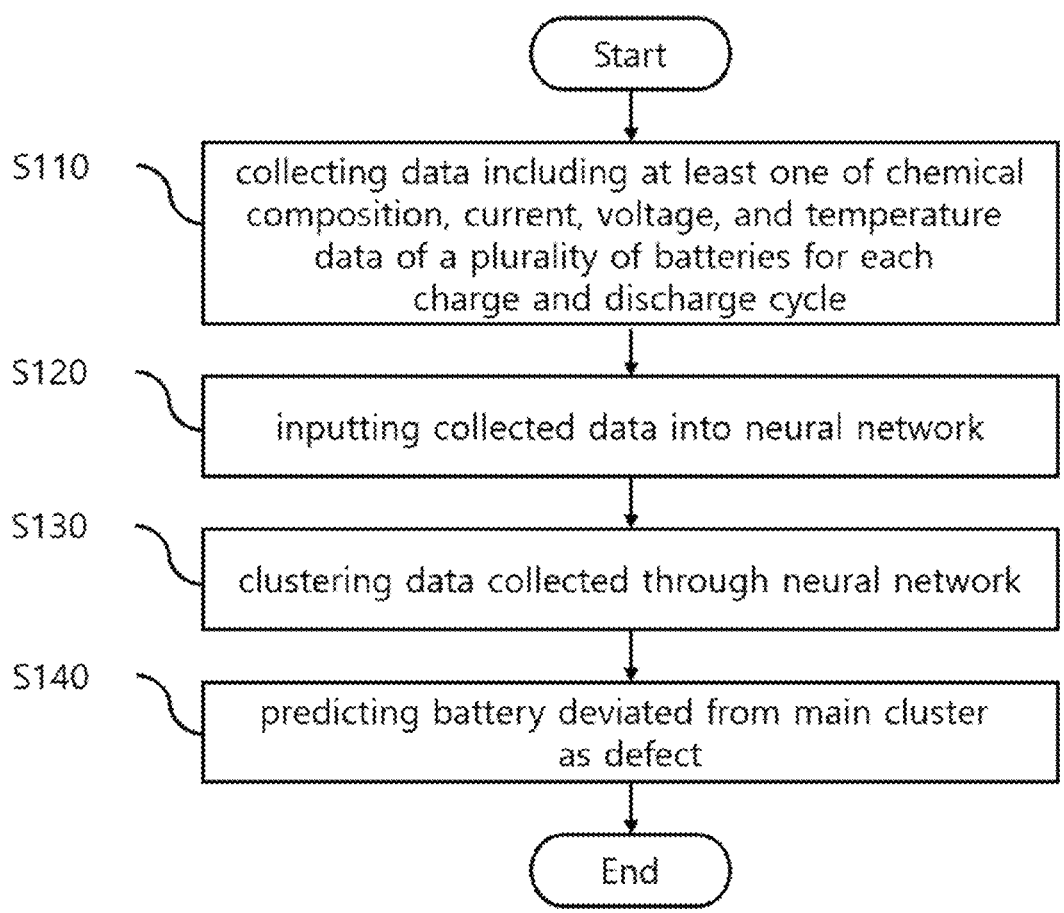
FIG. 1 is a flowchart showing a method based on neural network for pre-diagnosing defect and fire in battery cell, the neural network being related to self-supervised learning, according to an embodiment of the present invention.

It should be noted that the technical terms used in the present specification are only used to describe specific embodiments, and are not intended to limit the present invention. In addition, unless otherwise defined in the specification, technical terms used in the present specification should be interpreted as having a meaning generally understood by those of ordinary skill in the art to which the present invention belongs, and should not be interpreted as an excessively comprehensive meaning or an excessively reduced meaning. In addition, when a technical term used in the present specification is an incorrect technical term that does not accurately express the spirit of the present invention, it should be replaced with a technical term that can be correctly understood by those skilled in the art. In addition, general terms used in the present invention should be interpreted as defined in the dictionary or according to the context before and after, and should not be interpreted as an excessively reduced meaning.

In addition, the singular expression used in the present specification includes a plurality of expressions unless the context clearly indicates otherwise. In the present application, terms such as "consisting of" or "comprising" should not be construed as necessarily including all of the various elements or various steps described in the specification, and it should be construed that some of the components or steps may not be included or additional components or steps may be further included.

In addition, the suffixes "module" and "unit" for components used in the present specification are given or mixed in consideration of only the ease of writing the specification, and they do not have distinct meanings or roles themselves.

In addition, terms including ordinal numbers such as first and second used in the present specification may be used to describe various elements, but the elements should not be limited by the terms. These terms are used only for the purpose of distinguishing one component from another component. For example, a first component may be referred to as a second component without departing from the scope of the present invention, and similarly, the second component may also be referred to as the first component.

Since it is impossible to obtain actual data (i.e., labeling data indicating whether the battery is normal or defective) by charging and discharging 100 large batteries 1,000 times, a method based on neural network for pre-diagnosing defect and fire in battery cell according to the present invention is to collect data obtained by charging and discharging 50,000 batteries three times, for example, and diagnoses a defect of the battery cell.

Hereinafter, preferred embodiments according to the present invention will be described in detail with reference to the accompanying drawings, and regardless of the reference numerals, the same or similar elements are assigned the same reference numerals, and redundant descriptions thereof will be omitted.

In addition, in describing the present invention, when it is determined that a detailed description of a related known technology may obscure the subject matter of the present invention, a detailed description thereof will be omitted. In addition, it should be noted that the accompanying drawings are only for making it easier to understand the spirit of the present invention, and should not be construed as limiting the spirit of the present invention by the accompanying drawings.

FIG. 1 is a flowchart showing a method based on neural network for pre-diagnosing defect and fire in battery cell, the neural network being related to self-supervised learning, according to an embodiment of the present invention Referring to FIG. 1, an apparatus for pre-diagnosing defect and fire in battery cell (hereinafter, referred to as "battery cell defect and fire pre-diagnosis apparatus") collects data including at least one of chemical composition, current, voltage, and temperature data measured at predetermined time intervals within each charge and discharge cycle while charging and discharging a plurality of batteries (S110).

The battery cell defect and fire pre-diagnosis apparatus inputs the collected data into a neural network (S120).

The battery cell defect and fire pre-diagnosis apparatus clusters data collected through the neural network (S130).

The battery cell defect and fire pre-diagnosis apparatus predicts a battery deviated from a main cluster as a defect (S140). Specifically, the battery cell defect and fire pre-diagnosis apparatus according to the present invention infers voltage and temperature data of the latter part on the basis of time series voltage and temperature data of the former part, or inferring voltage and temperature data of the latter part on the basis of time series current data of the former part, and determines a defective battery on the basis of the degree to which the data in the latter part is not well predicted by using the principle that the data of a defective battery showing a data trend different from that of a normal battery is not well predicted.

The battery cell defect and fire pre-diagnosis apparatus according to the present invention may configure the entire artificial neural network by using a dilated CNN as the basic structure and repeatedly stacking the dilated CNN and batch normalization techniques, in order to analyze the association between long time series data. In addition, the battery cell defect and fire pre-diagnosis apparatus may use a 1D-CNN in the latter part of the neural network, in order to reduce the dimension of long time series data.

Figure 2:
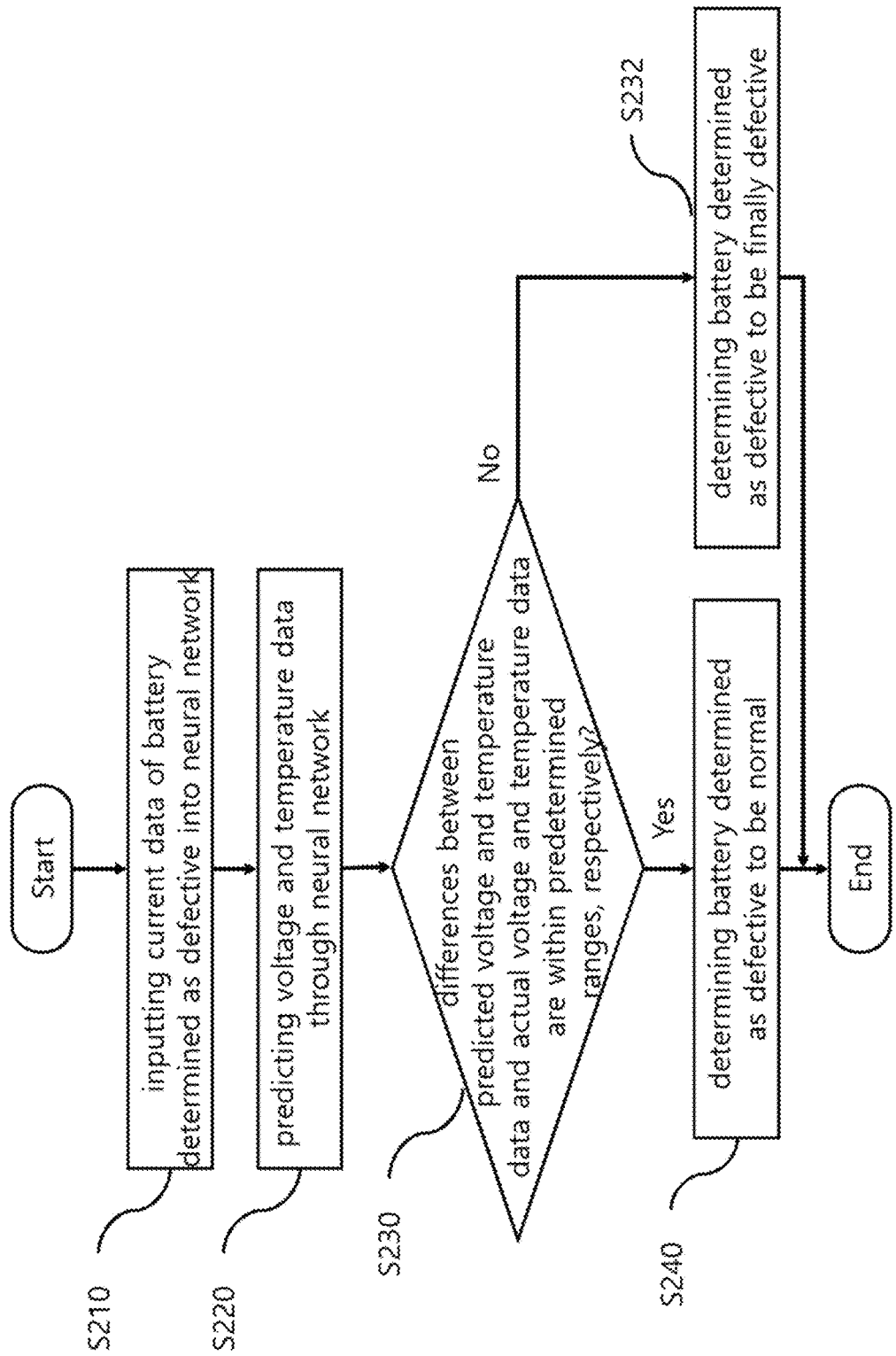
FIG. 2 is a flow chart showing a specific method of step S140 of FIG. 1.

FIG. 2 is a flow chart showing a specific method of step S140 of FIG. 1.

Referring to FIG. 2, the battery cell defect and fire pre-diagnosis apparatus inputs current data of a battery determined as defective into a neural network (S210).

The battery cell defect and fire pre-diagnosis apparatus predicts voltage and temperature data through the neural network (S220).

The battery cell defect and fire pre-diagnosis apparatus compares the predicted voltage and temperature data with the actual voltage and temperature data, respectively, and determines whether the differences between the predicted voltage and temperature data and the actual voltage and temperature data are within predetermined ranges, respectively (S230).

When the differences between the predicted voltage and temperature data and the actual voltage and temperature data are within the predetermined ranges, respectively, the battery cell defect and fire pre-diagnosis apparatus determines the battery determined as defective to be normal (S240).

The battery cell defect and fire pre-diagnosis apparatus determines the battery determined as defective to be finally defective, when the differences between the predicted voltage and temperature data and the actual voltage and temperature data are out of the predetermined ranges, respectively (S232).

Figure 3:
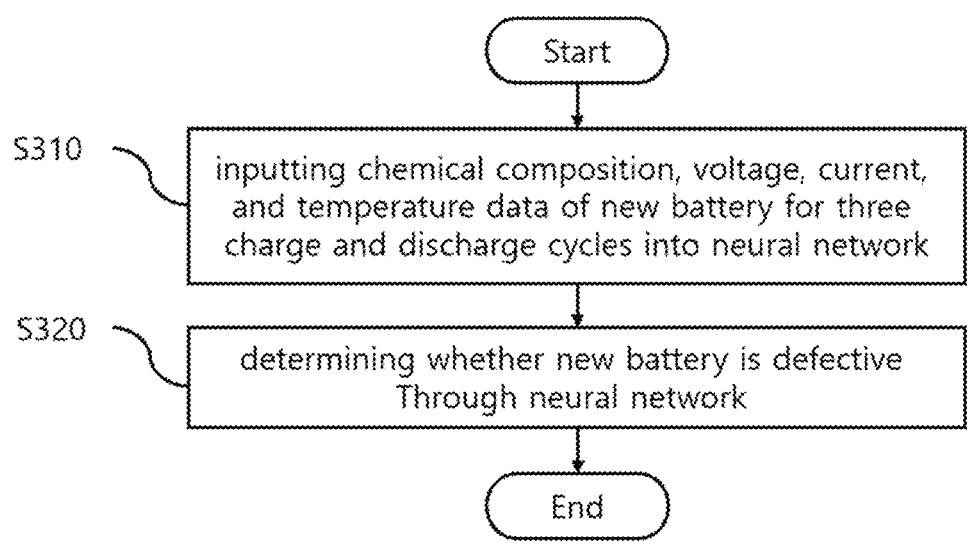
FIG. 3 is a flowchart illustrating a method of determining a defect of a new battery by inputting data of a new battery to the neural network for which learning is completed in FIG. 1.

FIG. 3 is a flowchart illustrating a method of determining a defect of a new battery by inputting data of the new battery to the neural network for which learning is completed in FIG. 1

Referring to FIG. 3, the battery cell defect and fire pre-diagnosis apparatus inputs chemical composition, voltage, current, and temperature data of a new battery for three charge and discharge cycles, into the neural network for which learning is completed as in FIG. 1 (S310).

The battery cell defect and fire pre-diagnosis apparatus determines whether a new battery is defective through the neural network for which learning is completed (S320).

Figure 4:
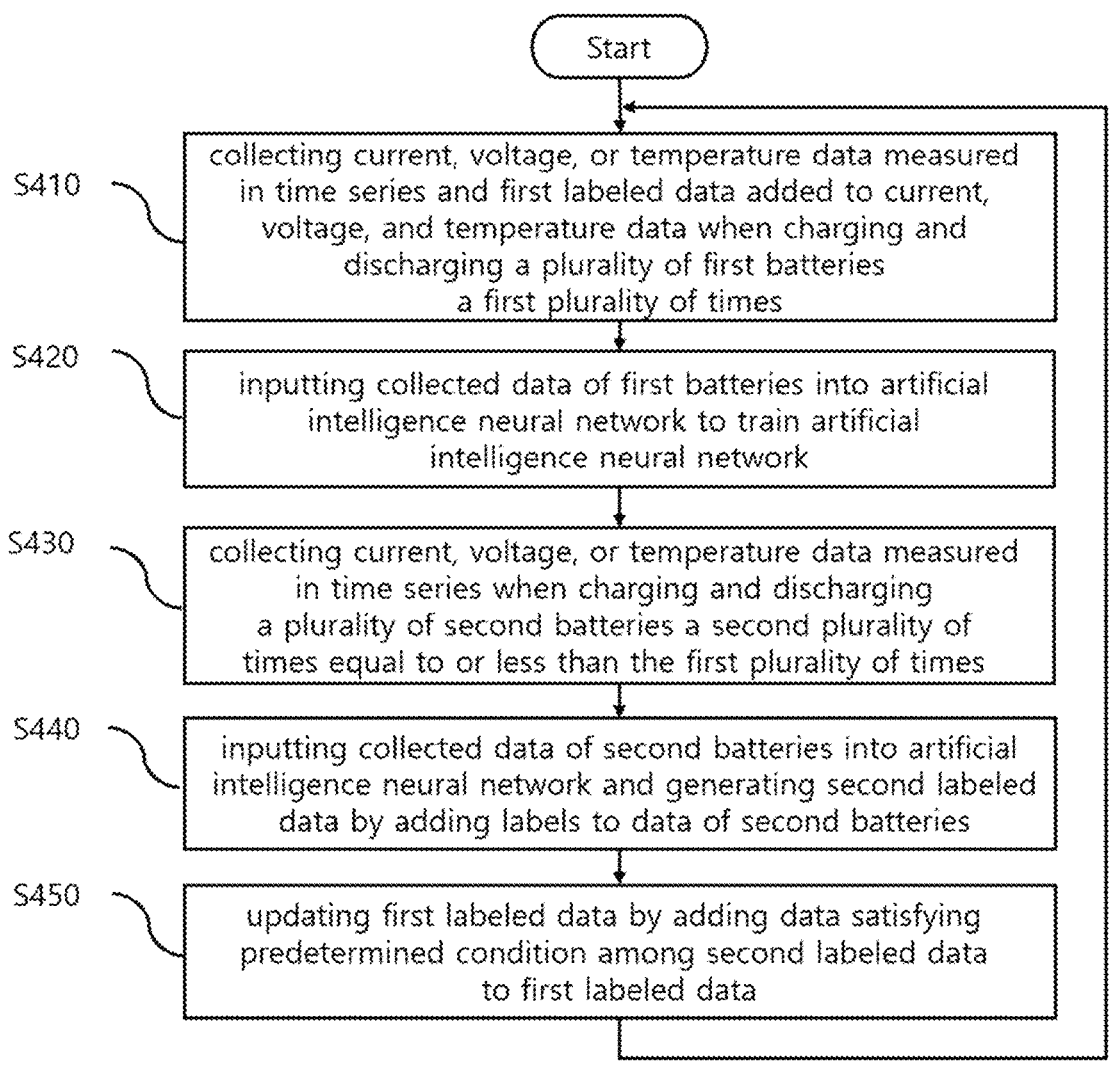
FIG. 4 is a flow chart showing a method based on neural network for pre-diagnosing defect and fire in battery cell, the neural network being related to semi-supervised learning, according to an embodiment of the present invention.

FIG. 4 is a flow chart showing a method based on a neural network for pre-diagnosing defect and fire in battery cell, the neural network being related to semi-supervised learning, according to an embodiment of the present invention. The semi-supervised learning is a type of machine learning that uses both a small amount of labeled data and a large amount of unlabeled data during training.

Referring to FIG. 4, the battery cell defect and fire pre-diagnosis apparatus collects current, voltage, or temperature data measured in time series and first labeled data added to the current, voltage, and temperature data, when charging and discharging a plurality of first batteries a first plurality of times (S410).

The battery cell defect and fire pre-diagnosis apparatus inputs the collected data of the first batteries into an artificial intelligence neural network, thereby training the artificial intelligence neural network (S420).

The battery cell defect and fire pre-diagnosis apparatus collects current, voltage, or temperature data measured in time series when charging and discharging a plurality of second batteries a second plurality of times equal to or less than the first plurality of times (S430).

The battery cell defect and fire pre-diagnosis apparatus inputs the collected data of the second batteries into the trained artificial intelligence neural network and generates second labeled data by adding labels to the data of the second batteries (S440).

The battery cell defect and fire pre-diagnosis apparatus updates the first labeled data by adding data satisfying a predetermined condition among the second labeled data to the first labeled data (S450). That is, the battery cell defect and fire pre-diagnosis apparatus discards a result value of low reliability among the second labeled data and adds a result value of high reliability to the first labeled data.

The battery cell defect and fire pre-diagnosis apparatus trains an artificial intelligence neural network for a battery cell defect diagnosis method using the first labeled data updated by repeating steps S410 to S450.

The above-described method may be implemented through various means. For example, embodiments of the present invention may be implemented by hardware, firmware, software, or a combination thereof.

In the case of hardware implementation, the method according to embodiments of the present invention may be implemented by one or more application specific integrated circuits (ASICs), digital signal processors (DSPs), digital signal processing devices (DSPDs), and programmable logic devices (PLDs), field programmable gate arrays (FPGAs), processors, controllers, microcontrollers, microprocessors, and the like.

For implementation by firmware or software, the method according to the embodiments of the present invention may be implemented in the form of a module, procedure, or function that performs the functions or operations described above. The software code may be stored in a memory unit and driven by a processor. The memory unit may be located inside or outside the processor, and may exchange data with the processor through various known means.

Hereinafter, a battery cell defect and fire pre-diagnosis apparatus 500 according to an embodiment of the present invention will be described in detail.

Figure 5:
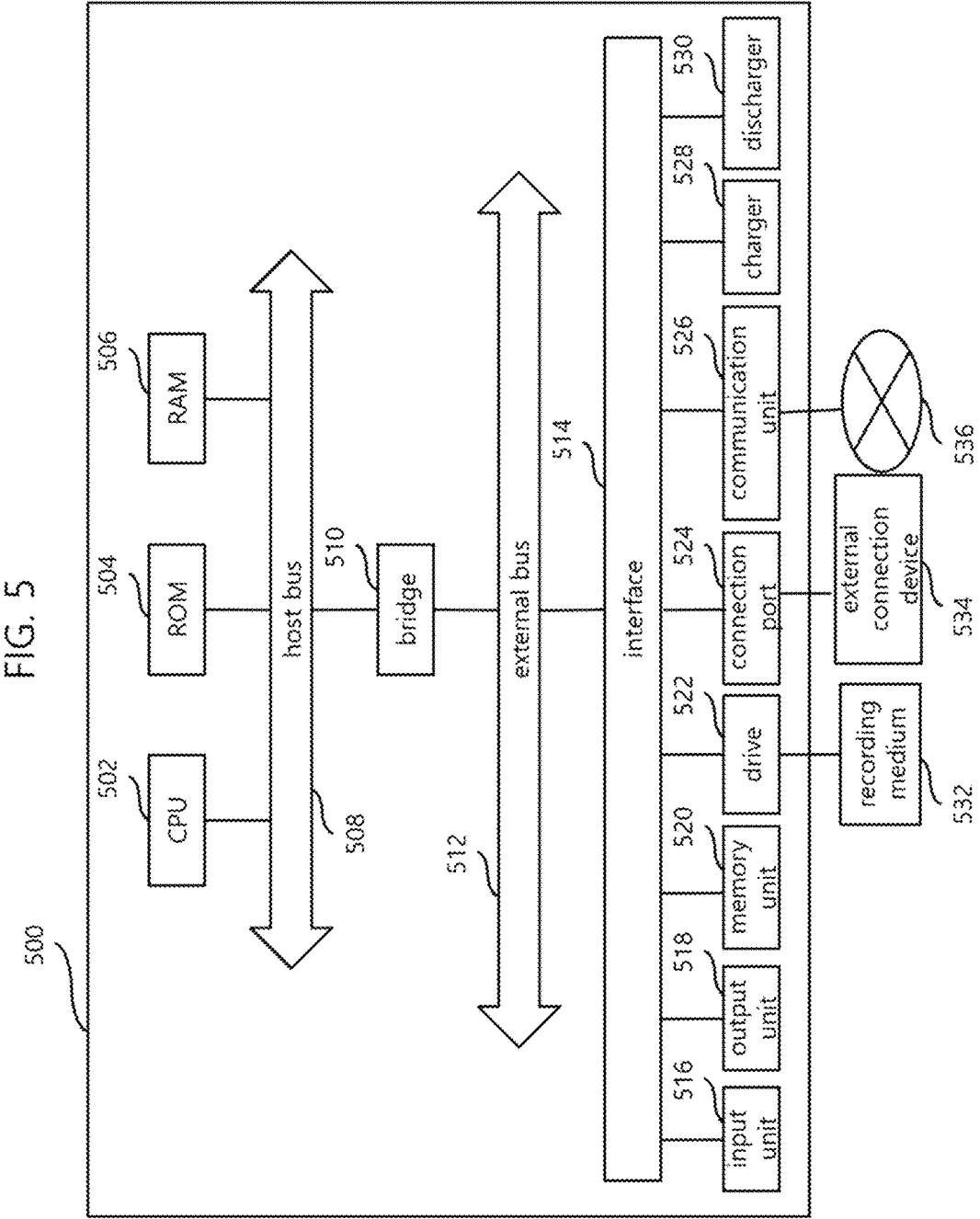
FIG. 5 is a block diagram showing an example of hardware capable of realizing a function of an apparatus for pre-diagnosing defect and fire in battery cell, according to the embodiment of the present invention.

Referring to FIG. 5, hardware capable of implementing the function of the battery cell defect and fire pre-diagnosis apparatus 500 will be described. FIG. 5 is a block diagram showing an example of hardware capable of implementing the function of the battery cell defect and fire pre-diagnosis apparatus according to the embodiment of the present invention.

The function of the battery cell defect and fire pre-diagnosis apparatus 500 may be realized using, for example, hardware resources shown in FIG. 5. That is, the function of the battery cell defect and fire pre-diagnosis apparatus 500 is realized by controlling a hardware shown in FIG. 5 using a computer program.

As shown in FIG. 5, the hardware mainly includes a CPU 502, a read only memory (ROM) 504, a RAM 506, a host bus 508, and a bridge 510. In addition, the hardware includes an external bus 512, an interface 514, an input unit 516, an output unit 518, a memory unit 520, a drive 522, a connection port 524, a communication unit 526, a charger 528, and a discharger 530.

The CPU 502 functions as, for example, an arithmetic processing device or a control device, and controls all or a part of operation of each component on the basis of various programs recorded in the ROM 504, the RAM 506, the memory unit 520, or a removable recording medium 532. The ROM 504 is an example of a storage device that stores data used for the read program or calculation in the CPU 502. The RAM 506 temporarily or permanently stores a program read from the CPU 502, various parameters that change when the program is executed, and the like, for example.

These components are connected to each other via, for example, a host bus 508 capable of high-speed data transfer. Meanwhile, the host bus 508 is connected to an external bus 512 having a relatively low data transfer rate through, for example, a bridge 510. In addition, as the input unit 516, for example, a mouse, a keyboard, a touch panel, a touch pad, a button, a switch, and a lever are used. Further, as the input unit 516, a remote controller capable of transmitting a control signal using infrared rays or other radio waves may be used. As the output unit 518, for example, a display device such as a cathode ray tube (CRT), a liquid crystal display (LCD), a plasma display panel (PDP), or an electro-luminescence display (ELD) may be used. Further, as the output unit 518, an audio output device such as a speaker or headphones, or a printer may be used.

The memory unit 520 is a device for storing various types of data. As the memory unit 520, for example, a magnetic storage device such as an HDD is used. Further, as the memory unit 520, a semiconductor storage device such as a solid state drive (SSD) or a RAM disk, an optical storage device, a magneto-optical storage device, or the like may be used.

The drive 522 is a device that reads information recorded on the removable recording medium 532, which is a removable recording medium, or writes information to the removable recording medium 532. As the removable recording medium 532, for example, a magnetic disk, an optical disk, a magneto-optical disk, a semiconductor memory, or the like is used. In addition, a program defining the operation of the battery cell defect and fire pre-diagnosis apparatus 500 may be stored in the removable recording medium 532.

The connection port 524 is a port available for connection to an external connection device 534, such as a universal serial bus (USB) port, an IEEE 1394 port, a small computer system interface (SCSI), an RS-232C port, an optical audio terminal, or the like. As the external connection device 534, for example, a printer or the like is used.

The communication unit 526 is a communication device available for connection to a network 536. As the communication unit 526, for example, a communication circuit for wired or wireless LAN, a communication circuit for wireless USB (WUSB), a communication circuit for a mobile phone network, or the like may be used. The network 536 may be connected via, for example, wire or wireless.

The charger 528 converts the input AC power into DC power, and supplies the converted DC power to a plurality of batteries connected in series. The charger 528 may be configured to automatically set a charging schedule according to the chemical composition received under the control of the CPU 502.

The discharger 530 is configured to supply charging voltages of the plurality of charged batteries to a load and discharge them. The discharger 530 may be configured to automatically set a discharge schedule according to the chemical composition received under the control of the CPU 502.

The hardware of the battery cell defect and fire pre-diagnosis apparatus 500 has been described in the above. In addition, the above-described hardware is an example, and variations in which some elements are omitted, variations in which new elements are added, and so on are possible. For example, the battery cell defect and fire pre-diagnosis apparatus 500 may be used as lithium battery cell defect detection equipment capable of being utilized in a battery production factory.

Figure 6:
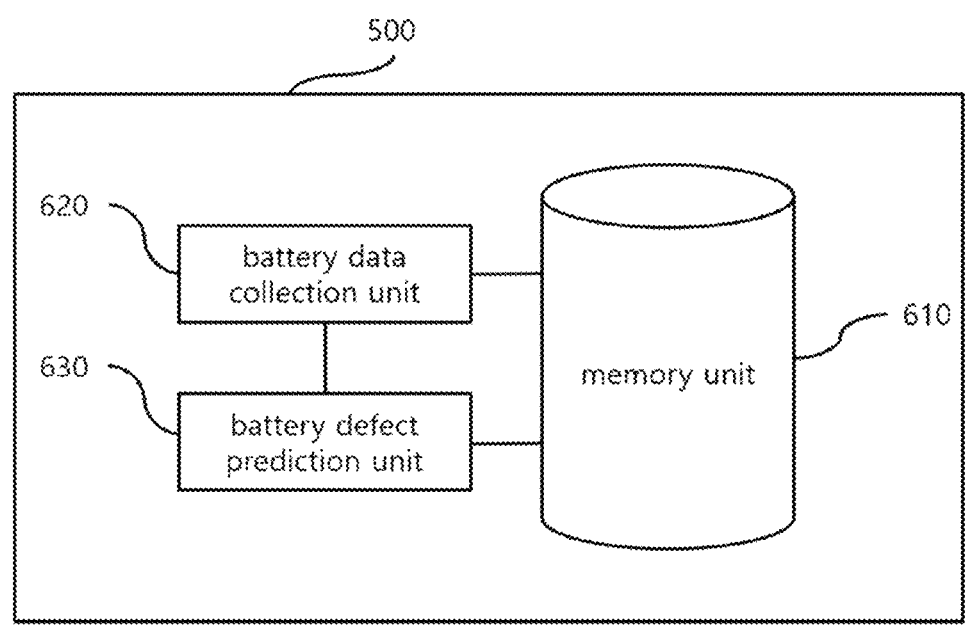
FIG. 6 is a block diagram showing an example of a function of an apparatus for pre-diagnosing defect and fire in battery cell, according to the embodiment of the present invention.

Next, referring to FIG. 6, the function of the battery cell defect and fire pre-diagnosis apparatus 500 will be described. FIG. 6 is a block diagram showing an example of the function of the battery cell defect and fire pre-diagnosis apparatus according to the embodiment of the present invention.

As shown in FIG. 6, the battery cell defect and fire pre-diagnosis apparatus 500 may include a memory unit 610, a battery data collection unit 620, and a battery defect prediction unit 630.

In addition, the function of the memory unit 610 is realized using the RAM 506, memory unit 520, or the like, which are described above. The function of the battery data collection unit 620 may be realized using the communication unit 526 or the like, which are described above. The function of the battery defect prediction unit 630 may be realized using the CPU 502 or the like, which are described above.

The memory unit 610 stores data including chemical composition, voltage, current, and temperature.

The battery data collection unit 620 collects data output for each cycle and further at predetermined time intervals within each cycle and stores the data in the memory unit 610 while charging and discharging the battery by a predetermined number of cycles. Here, according to the embodiment of the present invention, the predetermined number of cycles is limited to 3, but is not limited thereto and may be set to 3 or more.

The battery defect prediction unit 630 inputs data stored in the memory unit 610 into a neural network, clusters data collected through the neural network, and predicts a battery deviated from a main cluster as a defect. Specifically, the battery defect prediction unit 630 infers voltage and temperature data of the latter part based on time series voltage and temperature data of the former part or infers voltage and temperature data of the latter part on the basis of time series current data of the front part, and determines a defective battery on the basis of a degree to which the data of the latter part is not well predicted, by using a principle that is not well predicted for data of a defective battery showing a data trend different from that of a normal battery.

In addition, the battery defect prediction unit 630 inputs the current data of the battery determined as defective into the neural network, predicts voltage and temperature data through the neural network, compares the predicted voltage and temperature data with the actual voltage and temperature data, respectively, and determines the battery determined as defective to be finally defective when the differences between the predicted voltage and temperature data and the actual voltage and temperature data are out of predetermined ranges, respectively.

In addition, the battery defect prediction unit 630 may input chemical composition, voltage, current, and temperature data of the new battery into the neural network for which training is previously completed for three charge and discharge cycles, and determine whether the new battery is defective through the neural network.

In addition, the battery defect prediction unit 630 collects current, voltage or temperature data measured in time series and first labeled data added to the current, voltage, and temperature data when charging and discharging a plurality of first batteries a first plurality of times, and inputs the collected data of the plurality of first batteries into the artificial intelligence neural network, thereby training the artificial intelligence neural network. In addition, the battery defect prediction unit 630 collects current, voltage, or temperature data measured in time series when charging and discharging a plurality of second batteries a second plurality of times equal to or less than the first plurality of times, inputs the collected data of the plurality of second batteries into the trained artificial intelligence neural network, generates second labeled data by adding labels to the data of the plurality of second batteries, and adds data satisfying a predetermined condition among the second labeled data to the first labeled data, thereby updating the first labeled data. That is, the battery defect prediction unit 630 discards a result value with low reliability among the second labeled data and adds a result value with high reliability to the first labeled data. As such, the battery defect prediction unit 630 repeats the steps of collecting the first labeled data and updating the first labeled data and trains the artificial intelligence neural network performing the battery cell defect diagnosis method by using the first labeled data that is updated.

Here, the battery defect prediction unit 630 uses a dilated convolution neural network (hereinafter referred to as "dilated CNN") as a basic structure in order to analyze the correlation between long time series data, and configures the entire artificial neural network by repeatedly stacking dilated CNN layers and batch normalization techniques. In addition, the battery defect prediction unit 630 may use a 1D-convolution neural network (CNN) in the latter part of the neural network in order to reduce the dimension of long time series data.

Dilated convolution is a type of convolution that was originally developed from wavelet decomposition. For example, refer to Holschneider, M.; Kronland-Martinet, R.; Morlet, J.; and Tchamitchian, Ph., A Real-Time Algorithm for Signal Analysis with the Help of the Wavelet Transform in Wavelets: Time-Frequency Methods and Phase Space, J. M. Combes et al., eds., pp. 286-297 (1987). However, semantic segmentation was applied to obtain particularly complex features. For example, refer to Yu, Fisher and Koltun, Vladlen, Multi-scale context aggregation by dilated convolutions, 2016 Int'l Conference on Learning Representations (ICLR) (hereinafter, "Yu et al. 2016").

Since feature maps may be created by convolving adjacent data in the input, in a pure CNN made up of convolutional layers without pooling, the receptive field of the unit may only grow linearly for each layer. Methods of increasing the receptive field are to convolve the input data in a larger area. This may be similar to using a dilation kernel in dilated convolution, instead of using the existing dense kernel for convolution in the related art.

Assuming that F is a discrete function, K is a convolution kernel, and dilated convolution *d is a generalized version of a typical convolution as defined in Equation 1 below, the convolution in the related art may be a simple 1-extension convolution (i.e., when d=1). Here, d is a dilation factor.

$$F *_d K(z) = \sum_{x+dy=z} F(x)K(y) \quad \text{[Equation 1]}$$

One advantage of applying the dilated convolution to CNN is that a dilated version has a larger receptive field. A dilated convolutional filter may be obtained by upsampling an original filter, that is, by inserting zeros between the elements of the original filter. Therefore, the filter dilated by design may have a structured pattern of zero elements. Compared to weight pruning where zero elements have random patterns and positions, the dilated filter may have a structured pattern for zero weights, and be more useful in reducing computational complexity in hardware and software. In particular, when many values are sequentially input to the neural network as in the present invention, there is an effect that the dilated convolution is utilized to lower the computational complexity and not reduce the accuracy of the result value.

Batch normalization refers to a work of normalizing (making normal distribution) activation values or output values of the activation function. Specifically, the batch normalization may be implemented by calculating the mean and standard deviation for each feature in mini-batch data. Because the artificial neural network is trained by performing batch normalization in mini-batch units, it is possible to reduce an internal covariate shift capable of occurring when training the artificial neural network.

Meanwhile, the present invention is not limited to configure the entire artificial neural network by repeatedly stacking dilated CNNs and batch normalization techniques, and may configure the artificial neural network through other methods.

By making a multilayer-perceptron obtained by stacking multiple perceptron neurons in layers, a recurrent neural network in which the connection between 1D or 2D CNNs or units has a cyclic structure, or an encoder-decoder structure using only attention, the artificial neural network may be configured in such a manner as to train the transformer architecture or the former part with CNN and the latter part with RNN. However, as in the present invention, since the neural network may be configured by using a dilated CNN for the former part and the middle part and a 1D CNN for the latter part, it is effective in various aspects, such as time efficiency, in the field of battery defect prediction to which the present invention is applied.

Figure 7:
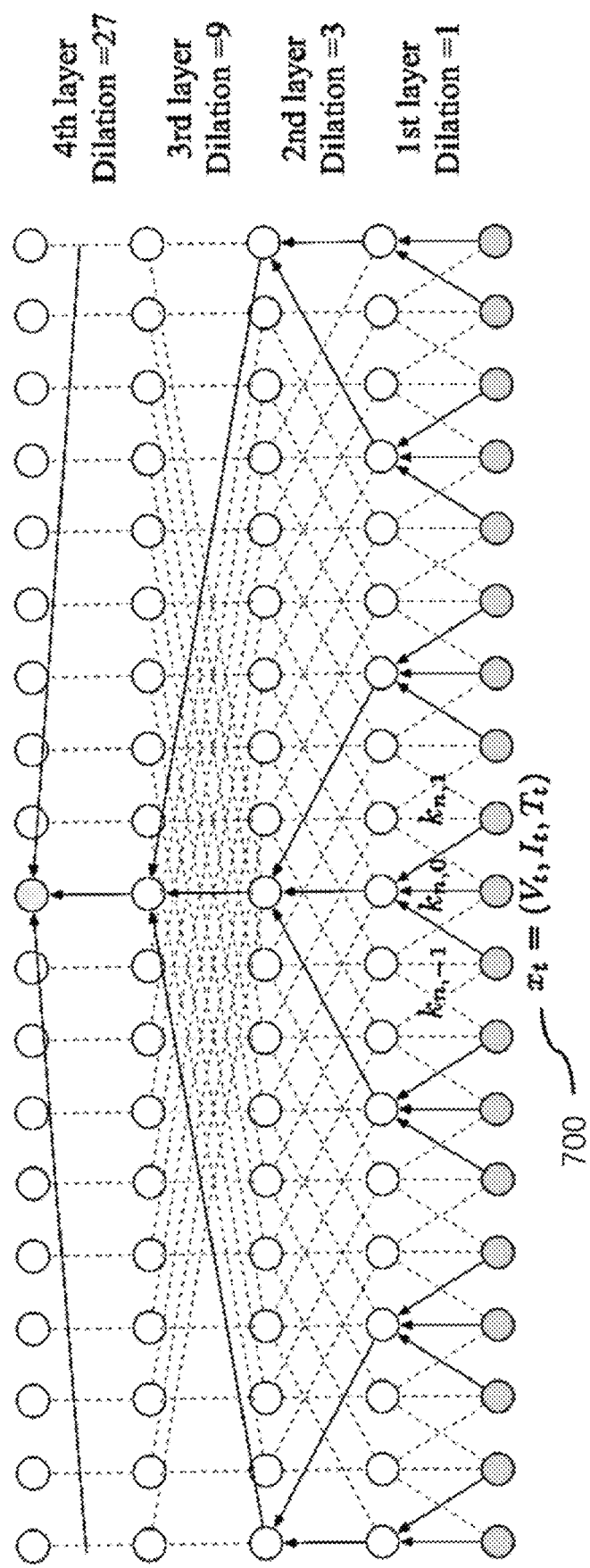
FIG. 7 is a diagram showing the structure of an artificial intelligence model according to an embodiment of the present invention.

FIG. 7 is a diagram showing the structure of an artificial intelligence model according to an embodiment of the present invention.

The artificial intelligence model receives a 3×2500 matrix consisting of current $I_1$, voltage $V_1$, and temperature $T_1$ for 2500 seconds. Here, the artificial intelligence model may be implemented with a dilated CNN capable of quickly learning the relationship between sample points for a generally long sample. Through this, it is possible to quickly learn a large number of pieces of data input in time series, thereby greatly reducing an amount of computer computation.

The artificial intelligence model passes inputs (current $I_1$, voltage $V_1$, temperature $T_1$) of 2500 seconds (about 3 cycles) through hundreds of thousands of parameters and outputs whether the battery is defective or not.

Referring to FIG. 7, a reference numeral 700 denotes a vector consisting of a current $I_1$, a voltage $V_1$, and a temperature $T_1$, and 2500 vectors exist. A current $I_1$, a voltage $V_1$, and a temperature $T_1$ are input to the vector to output whether the battery is defective or not.

In the above, embodiments disclosed in the present specification have been described with reference to the accompanying drawings. As described above, the embodiments shown in each drawing should not be interpreted as limiting, but can be combined with each other by those skilled in the art familiar with the content of the present specification. When combined, it may be interpreted that some components may be omitted.

Here, the terms or words used in the specification and claims should not be interpreted as being limited to a conventional or dictionary meaning, but should be interpreted as meanings and concepts consistent with the technical idea disclosed in the present specification.

Here, the terms or words used in the specification and claims should not be construed as being limited to a conventional or dictionary meaning, it should be interpreted as a meaning and concept consistent with the technical idea disclosed in this specification.

What is claimed is:

1. A method based on neural network for pre-diagnosing defect and fire in battery cell in an apparatus, the method comprising:
   collecting, by the battery cell defect and fire pre-diagnosis apparatus, data including at least one of chemical composition, current, voltage, and temperature data measured for each predetermined time interval within each charge and discharge cycle while charging and discharging a plurality of batteries;
   inputting, by the battery cell defect and fire pre-diagnosis apparatus, the collected data to the neural network;
   clustering, by the battery cell defect and fire pre-diagnosis apparatus, the collected data through the neural network and determining a battery deviated from a main cluster as defective, wherein the deviated battery from the main cluster is a defective battery;
   inputting, by the battery cell defect and fire pre-diagnosis apparatus, a current data of the defective battery to the neural network, wherein voltage and temperature data of the defective battery is predicted based on the current data of the defective battery;
   comparing, by the battery cell defect and fire pre-diagnosis apparatus, the predicted voltage and temperature data with actual voltage and temperature data, respectively; and
   determining, by the battery cell defect and fire pre-diagnosis apparatus,
      the defective battery as normal, if differences between the predicted voltage and temperature data and the actual voltage and temperature data are within predetermined ranges, respectively, and
      the defective battery as defective as final, if the differences between the predicted voltage and temperature data and the actual voltage and temperature data are out of the predetermined ranges, respectively.

2. The method of claim 1, further comprising:
   inputting, by the battery cell defect and fire pre-diagnosis apparatus, chemical composition, voltage, current, and temperature data of a new battery into the neural network for three charge and discharge cycles; and
   determining, by the battery cell defect and fire pre-diagnosis apparatus, whether the new battery is defective through the neural network.

3. The method of claim 1, further comprising:
   inferring, by the battery cell defect and fire pre-diagnosis apparatus, the voltage and temperature data of a second part on the basis of time series voltage and temperature data of a first part.

4. The method of claim 1, further comprising:
   inferring, by the battery cell defect and fire pre-diagnosis apparatus, the voltage and temperature data of a second part on the basis of time series current data of a first part.

5. The method of claim 1, further comprising:
   detecting, by the battery cell defect and fire pre-diagnosis apparatus, a defective battery cell through the neural network obtained by adding the neural network learned through data including a label indicating normal or defective battery to the neural network learned through a self-supervised learning.

6. A method based on neural network for pre-diagnosing defect and fire in battery cell, the method comprising:
   inputting, by a battery cell fault diagnosis apparatus, current, voltage, or temperature data measured in time series to an artificial intelligence neural network for a battery cell defect diagnosis method and adding first labeled data to the current, voltage, and temperature data when charging and discharging a plurality of first batteries a first plurality of times;

generating, by the battery cell defect and fire pre-diagnosis apparatus, second labeled data by adding labels to the current, voltage, and temperature data measured in time series when charging and discharging a plurality of second batteries a second plurality of times equal to or less than the first plurality of times, by using the trained artificial intelligence neural network; and clustering, by the battery cell defect and fire pre-diagnosis apparatus, the first labeled data and the second labeled data through artificial intelligence neural network and determining the defect and fire in the battery cell which is deviated from a main cluster, wherein the deviated battery cell from the main cluster is pre-diagnosed as the defect and fire in the battery cell.

7. An apparatus for pre-diagnosing defect and fire in battery cell, the apparatus comprising:

a memory storing one or more instructions;

one or more processors constituting a neural network;

a charger charging plurality of batteries;

a discharger discharging the plurality of batteries, wherein the one or more processors automatically sets a charging schedule of the charger according to input chemical composition, and automatically sets a discharge schedule of the discharger according to the input chemical composition; and one or more units configured and executed by the one or more processors, comprising:

a battery data collection unit, based on the set charging and discharging schedules, collecting data including at least one of the chemical composition, current, voltage, and temperature data measured at predetermined time intervals within each charge and discharge cycle while charging and discharging the plurality of batteries; and a battery defect prediction unit inputting the collected data to the neural network, clustering the collected data through the neural network, and determining a battery deviated from a main cluster as defective, wherein the deviated battery from the main cluster is a defective battery.

8. The apparatus of claim 7, wherein the one or more processors adds a label to data of the battery determined as defective among the plurality of batteries, and inputs the labeled data to the neural network to train the neural network.

* * * * *